(12) United States Patent
Liu et al.

(10) Patent No.: US 8,348,139 B2
(45) Date of Patent: Jan. 8, 2013

(54) COMPOSITE SOLDER ALLOY PREFORM

(75) Inventors: Weiping Liu, New Hartford, NY (US); Ning-Cheng Lee, New Hartford, NY (US)

(73) Assignee: Indium Corporation, Clinton, NY (US)

( * ) Notice: Subject to any disclaimer, the term of this patent is extended or adjusted under 35 U.S.C. 154(b) by 0 days.

(21) Appl. No.: 12/720,532

(22) Filed: Mar. 9, 2010

(65) Prior Publication Data
US 2011/0220704 A1 Sep. 15, 2011

(51) Int. Cl.
*B23K 31/02* (2006.01)
(52) U.S. Cl. ................................ 228/246; 228/56.3
(58) Field of Classification Search .................. None
See application file for complete search history.

(56) References Cited

U.S. PATENT DOCUMENTS

| | | | | |
|---|---|---|---|---|
| 2,354,409 A | * | 7/1944 | Strasser | 428/672 |
| 2,362,893 A | * | 11/1944 | Durst | 428/647 |
| 2,503,564 A | | 4/1950 | Reeve | |
| 3,169,048 A | * | 2/1965 | McGinn | 428/647 |
| 3,172,385 A | * | 3/1965 | Varsane | 428/624 |
| 3,181,935 A | | 5/1965 | Coad | |
| 3,535,769 A | * | 10/1970 | Goldschmied | 228/170 |
| 3,754,318 A | | 8/1973 | Trost | |
| 4,034,454 A | * | 7/1977 | Galasso et al. | 428/576 |
| RE30,348 E | * | 7/1980 | Hascoe | 228/56.3 |
| 4,715,525 A | * | 12/1987 | Norris | 228/262.71 |
| 5,063,660 A | | 11/1991 | Fiedelius | |
| 5,127,969 A | | 7/1992 | Sekhar | |
| 5,130,509 A | | 7/1992 | Simpson | |
| 5,853,622 A | | 12/1998 | Gallagher et al. | |
| 5,881,944 A | * | 3/1999 | Edwards et al. | 228/56.3 |
| 5,922,397 A | | 7/1999 | Brandt et al. | |
| 6,095,400 A | * | 8/2000 | Liu | 228/56.3 |
| 6,165,885 A | | 12/2000 | Gaynes et al. | |
| 6,186,390 B1 | | 2/2001 | Tadauchi et al. | |
| 6,203,929 B1 | * | 3/2001 | Muller | 428/643 |
| 6,268,659 B1 | * | 7/2001 | Huebner et al. | 257/766 |
| 6,278,184 B1 | * | 8/2001 | Brofman et al. | 257/737 |
| 6,339,120 B1 | | 1/2002 | Misra | |
| 6,620,515 B2 | | 9/2003 | Feng et al. | |

(Continued)

FOREIGN PATENT DOCUMENTS

EP 1 642 667 A1 4/2006

(Continued)

OTHER PUBLICATIONS

NN82056430 IBM Technical Disclosure Bulletin 1982.*

(Continued)

*Primary Examiner* — Kiley Stoner
(74) *Attorney, Agent, or Firm* — Sheppard Mullin Richter & Hampton LLP

(57) ABSTRACT

Various embodiments of the invention provide laminate composite preform foils for high-temperature Pb-free soldering applications. The laminate composite preform foil is composed of a high-melting, ductile metal or alloy core layer and a low-melting solder coating layer at either side of the core layer. During soldering, the core metal, liquid solder layer, and substrate metals react and consume the low-melting solder phase to form high-melting intermetallic compound phases (IMCs). The resultant solder joint is composed of a ductile core layer sandwiched by the IMCs layers at substrate sides. The joint has a much higher remelt temperature than the original melting temperature of the initial solder alloy coating, allowing subsequent mounting of packaged devices.

13 Claims, 19 Drawing Sheets

U.S. PATENT DOCUMENTS

| | | | |
|---|---|---|---|
| 6,772,936 B2 * | 8/2004 | Polvi | 228/246 |
| 6,797,758 B2 | 9/2004 | Misra | |
| 6,923,882 B2 | 8/2005 | Iwamoto et al. | |
| 6,940,721 B2 | 9/2005 | Hill | |
| 7,332,807 B2 | 2/2008 | Dani et al. | |
| 2002/0092895 A1 | 7/2002 | Blackshear | |
| 2002/0148880 A1 | 10/2002 | Brink | |
| 2003/0189082 A1 * | 10/2003 | Dockus et al. | 228/56.3 |
| 2004/0112478 A1 | 6/2004 | Bieler et al. | |
| 2004/0115340 A1 | 6/2004 | Griego | |
| 2004/0134966 A1 * | 7/2004 | Chang et al. | 228/56.3 |
| 2004/0188496 A1 * | 9/2004 | Liu | 228/56.3 |
| 2005/0148721 A1 | 7/2005 | Tonapi et al. | |
| 2005/0228097 A1 | 10/2005 | Zhong | |
| 2005/0238906 A1 | 10/2005 | Cooper et al. | |
| 2006/0186550 A1 | 8/2006 | Ikeda et al. | |
| 2006/0194920 A1 | 8/2006 | Capote | |
| 2007/0029369 A1 | 2/2007 | Watkins et al. | |
| 2007/0089811 A1 * | 4/2007 | Ikeda et al. | 148/536 |
| 2007/0145546 A1 * | 6/2007 | Lewis et al. | 257/675 |
| 2007/0152026 A1 * | 7/2007 | Suh et al. | 228/193 |
| 2007/0205253 A1 * | 9/2007 | Hubner | 228/193 |
| 2007/0256761 A1 | 11/2007 | Hwang | |
| 2007/0292708 A1 | 12/2007 | Pereira | |
| 2008/0035707 A1 | 2/2008 | Glaeser | |
| 2008/0087710 A1 * | 4/2008 | Glaeser | 228/121 |
| 2008/0105956 A1 * | 5/2008 | Steckhan | 257/666 |
| 2008/0156475 A1 | 7/2008 | Suh | |
| 2008/0185713 A1 | 8/2008 | Dani et al. | |
| 2008/0211104 A1 | 9/2008 | Mehrotra | |
| 2008/0233682 A1 | 9/2008 | Suh et al. | |
| 2009/0004500 A1 | 1/2009 | Suh et al. | |
| 2009/0044966 A1 | 2/2009 | Tazawa | |
| 2009/0243089 A1 | 10/2009 | Hohlfeld et al. | |

FOREIGN PATENT DOCUMENTS

| | | | |
|---|---|---|---|
| JP | 2002-224882 A * | 8/2002 | |
| WO | 9741594 A1 | 11/1997 | |
| WO | 9839781 A1 | 9/1998 | |
| WO | 0234458 A1 | 5/2002 | |
| WO | 02099146 A1 | 12/2002 | |
| WO | 2005064677 A1 | 7/2005 | |
| WO | 2006074165 A2 | 7/2006 | |
| WO | 2006074165 A3 | 12/2006 | |
| WO | 2008091825 A2 | 7/2008 | |
| WO | 2008091825 A3 | 10/2008 | |

OTHER PUBLICATIONS

International Search Report and the Written Opinion for International App No. PCT/US2011/027759, mailed May 31, 2011, Authorized Officer: Ugarte, Eva.

* cited by examiner

COMPOSITE SOLDER ALLOY PREFORM

TECHNICAL FIELD

The present invention relates generally to soldering, and more particularly, some embodiments relate to solder preforms for high-temperature lead-free soldering applications.

DESCRIPTION OF THE RELATED ART

High temperature solder alloys are extensively used in die attach, power semiconductor and optical device packaging, flip-chip packaging, heat-sink joining, etc. Current industry standard solders for these applications are mainly high-lead solders (90-95 wt % Pb) and Au-based eutectic solder alloys such as the 80Au20Sn solder. The die attach process involves connecting a silicon die or chip to a lead frame or other substrate using adhesive bonding or solder joining. Soldering is a preferred method for die attach to a lead frame, especially for power devices because of the higher current carrying capability and better thermal conductivity of a solder alloy than an adhesive. The latter feature proves to be beneficial in dissipating the heat generated by the device. Solders used for die attach usually have a liquidus temperature of 280° C. or above to allow subsequent mounting of packaged devices on printed circuit boards with eutectic SnPb or lead free SnAgCu (SAC) solders by reflow soldering at a temperature of 200 to 250° C.

The most widely used solders for die attach are the high-Pb alloys, e.g., 95Pb5Sn, 88Pb10Sn2Ag, and 92.5Pb5Sn2.5Ag. However, Pb is poisonous, and its use is banned in many applications. Although the high-Pb solder alloys for the first level packaging applications are exempted from the current Restriction of Hazardous Substances Directive (RoHS) regulations because of the lack of a reliable replacement for them, the conversion to Pb-free materials in these areas will eventually be implemented. The Pb-free eutectic Au—Sn (280° C.), Au—Si (363° C.), and Au—Ge (356° C.) alloys can be used as die attach solders, but the cost is too high. Although other high temperature lead-free solders in the Sn—Sb, Bi—Ag, Zn—Sn, and Zn—Al systems are also known to be candidates, each has its own drawbacks. For example, the solidus temperatures of Sn—Sb and Zn—Sn alloys are too low, the Zn—Al alloys are highly corrosive and easily oxidize, and the Bi—Ag alloys have brittleness and low thermal/electrical conductivity issues.

BRIEF SUMMARY OF EMBODIMENTS OF THE INVENTION

Various embodiments of the invention provide laminate composite preform foils for high-temperature Pb-free soldering applications. The laminate composite preform foil is composed of a high-melting, ductile metal or alloy core layer and a low-melting solder coating layer at either side of the core layer. During soldering, the core metal, liquid solder layer, and substrate metals react and consume the low-melting solder phase to form high-melting intermetallic compound phases (IMCs). The resultant solder joint is composed of a ductile core layer sandwiched by the IMCs layers at substrate sides. The joint has a much higher remelt temperature than the original melting temperature of the initial solder alloy coating, allowing subsequent mounting of packaged devices.

According to an embodiment of the invention, a composite preform foil, comprises a core metal layer comprising a metal selected from the group consisting of Ag, Au, Pd, Pt, Cu, Ni, Co, Fe, Mn, Mg, Ti, Zr, or alloys thereof, the alloy having a solidus temperature greater than 280° C.; a first solder layer joined to the core metal layer, the first solder layer comprising a Sn-based solder or an In-based solder, and the first solder layer having a thickness equal to or greater than 5 µm; and a second solder layer joined to the core metal layer, the second solder layer comprising a Sn-based solder or an In-based solder, and the second solder layer having a thickness equal to or greater than 5 µm; wherein the core metal layer has a sufficient thickness such that a layer of the metal remains after isothermal solidification in reflow soldering.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

Some of the figures included herein illustrate various embodiments of the invention from different viewing angles. Although the accompanying descriptive text may refer to such views as "top," "bottom" or "side" views, such references are merely descriptive and do not imply or require that the invention be implemented or used in a particular spatial orientation unless explicitly stated otherwise.

FIGS. 6E and 6C are illustrations of the solder joint of FIG. 6D.

The figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE EMBODIMENTS OF THE INVENTION

The present invention is directed toward composite preforms for use in high-temperature soldering applications where a melting point of 280° C. or higher is required. In some embodiments, a composite preform foil is composed of a high-melting, ductile metal or alloy core layer and a low-melting solder coating layer at either side of the core layer. During soldering, the core metal and the liquid solder layer together with the substrate metals to be joined react to form high-melting intermetallic compound phases (IMCs) that consume the low-melting solder phase rapidly in a process known as transient liquid phase (TLP) bonding. The resultant solder joint is composed of a ductile core layer sandwiched by the IMCs layers at substrate sides, with a much higher remelt temperature than the melting temperature of the initial solder alloy coating. The laminate composite structure of the solder joint increases the strength and fracture toughness of the joint.

Figure 1:
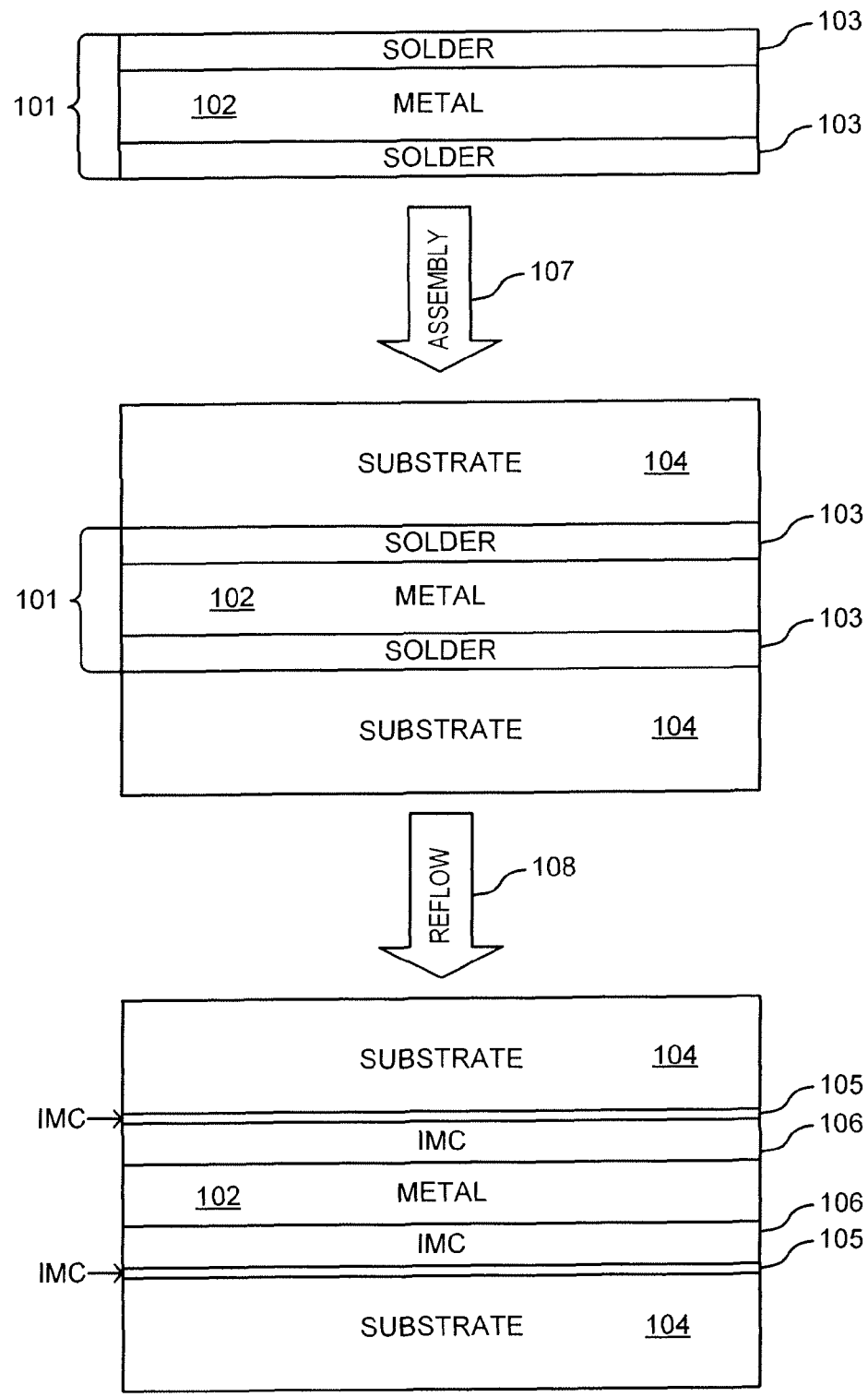
FIG. 1 is a diagram illustrating a composite preform foil and method of bonding according to an embodiment of the invention.

FIG. 1 illustrates a composite preform and soldering process according to an embodiment of the invention. Composite preform 101 comprises a metal or metal alloy foil 102 coated with solder to form solder layers 103 on the top and bottom of the metal foil 102. During assembly 107, the composite preform 101 is sandwiched between the substrates 104 to be joined. In some embodiments, a suitable amount of flux is also applied between the preform 101 and the substrates 104. Alternatively, flux-coated composite preform 101 can be used. After assembly, reflow soldering 106 is used to bond the substrates. A reflow oven is used with an appropriate reflow profile chosen with respect to the composition and thickness of the solder used in solder layers 103. The reflow peak temperature and time above liquidus (TAL) are selected such that after reflow soldering the solder is converted into one or more IMC phases with the substrate 104 or metal layer 102. In some embodiments, the reflow profile is chosen such that the solder layer 103 is completely converted into IMCs. In other embodiments, the reflow profile may be chosen such that the solder layer 103 is not completely converted into IMCs, and some solder may remain after reflow. This remaining solder may be converted into IMC in later treatments or the excess solder may not impact further processing and may be allowed to remain. The resultant solder joint comprises a ductile core metal layer 102 sandwiched by intermetallic layers 106 and 105 on both sides between substrates 104. This joint has a composite IMCs/metal/IMCs laminate structure consisting of alternating hard layer (IMCs) 105, 106 and soft layer (metal 102), which increases the strength of the solder joint while maintaining the resistance to brittle fracture. Another characteristic of the solder joint formed is that it has a remelt temperature much higher than the initial preform 101. In some embodiments, the remelt temperature may be above 480° C. up to 724° C.

In some embodiments, the metal core layer 102 comprises a metal or metal alloy of sufficient ductility to allow the use of thick solder layers 103 that do not require special substrate surface preparation or high pressures during reflow soldering. In some embodiments, the thicknesses of the solder layers 103 may be symmetric, with both the top and bottom layers the same, while in others, the thicknesses of the solder layers 103 are asymmetric, with the top a different thickness than the bottom. For example, a solder preform with asymmetrical solder layer thicknesses may be employed for joining substrates having different compositions. The thickness of the metal core layer 102 is sufficiently large such that it is not completely consumed during isothermal solidification and so remains present as a separate component of the final joint. In some embodiments, the thickness of the metal layer 102 may be expressed as a ratio of the thickness of the solder layers 103. For example, the metal layer 102 may be between 2 and 10 times as thick as one of the solder layers 103. In other embodiments, the thickness of the metal layer 102 may be expressed as an absolute value. For example, the metal layer 102 may be between 10 and 100 µm. The minimum thickness of metal layer 102 may be determined according to the solder layer 103 thickness such that sufficient metal remains after reflow to provide a sufficiently ductile joint.

In the embodiment illustrated in FIG. 1, IMC layers 105 are composed of IMCs formed from components of the substrate 104 and the solder 103. For example, if solder 103 comprises a Sn—Ag solder and substrate 104 comprises Cu, then IMC layers 105 typically comprise a Cu—Sn IMC phase. Similarly, IMC layers 106 are composed of IMCs formed from components of the metal 102 and the solder 103. For example, if solder 103 comprises a Sn—Ag solder and metal layer 102 comprises Ag, then IMC layers 106 typically comprise a Ag—Sn IMC phase.

These IMC phases are typically brittle. Therefore, TLP bonding in high-temperature soldering applications, such as die-attach applications, uses very thin solder layers, such as solder layers having thicknesses of less than 3 µm. The use of these thin solder layers places certain undesirable constraints on the bonding process. Because of the low volume of solder, the substrate surfaces to be bonded must meet tight constraints; for example, they must have very low roughness, which typically requires further processing to commercially available substrates. Furthermore, with thin solder layers, the die and substrate must be placed under high pressure. The use of thin solder layers also frequently places constraints on type of substrates used; often, both substrates must be of the same material, or must be carefully matched. In these applications, increasing the thickness of the solder layers results in an unusable, brittle joint because of the IMC formation.

In the present invention, however, the presence of metal layer 102 allows the use of solder layers having thicknesses of 5 µm or more, for example solder layers having thicknesses between 5-50 µm. Ductile metal layer 102 improves the ductility and fracture toughness of the joint, enabling IMC layer thicknesses that would otherwise result in a too-brittle joint. This allows bonding to commercially standard substrates, without additional surface preparations, and normal reflow processes without applying significant pressures. Of course, such techniques may be used with embodiments of the invention, but are not necessary. Additionally, the metal layer 102 accelerates the consumption of the liquid phase during isothermal solidification in the reflow soldering process, reducing the total processing time over what would be required with solder alone. Furthermore, the metal layer 102 provides structural support for solder layers 103 in the preform 101.

In some embodiments, metal layer 102 is composed of a metal or metal alloy that reacts to form IMCs with components of solder layers 103. In some embodiments, solder layers 103 are composed of Sn based solders, such as Sn—Ag, Sn, SnCu, SnBi, SnSb, SnZn, SnAu, SnAgCu, SnAgBi, SnAgIn, SnAgSb, SnAgCuBi, SnAgCuIn, SnAgCuSb, or combinations thereof. In other embodiments, solder layers 103 are composed of In based solders, such as In, InAg, InCu, InBi, InSb, InAgCu, InAgBi, InAgSn, InAgSb, InAgCuBi, InAgCuIn, InAgCuSb, or combinations thereof. In further embodiments, one of the solder layers 103 may be composed of a different solder alloy than the other. For example, one solder layer may be composed of one Sn based solder while the other is composed of a different Sn based solder, or one solder layer may be composed of one In based solder while the other is composed of a different In based solder, or one solder layer may be composed of an Sn based solder while the other is composed of an In based solder.

In embodiments where a solder layer 103 comprises a Sn based solder, such as Sn—Ag solder, metal layer 102 comprises a metal or metal alloy that reacts with Sn to form intermetallic phases with melting temperatures greater than a predetermined minimum melting temperature, such as 280° C. Such metals may comprise Ag or a Ag-based alloy; additionally, metal layer 102 may comprise Au, Pd, Pt, Cu, Ni, Co, Fe, Mn, Mg, Ti, Zr, or alloys thereof. In embodiments where a solder layer 103 comprises an In based solder, such as In—Ag solder, metal layer 102 comprises a metal or metal alloy that reacts with In to form intermetallic phases with melting temperatures over a predetermined minimum melting temperature, such as 280° C. Such metals may comprise Ag or a Ag-based alloy; additionally, metal layer 102 may comprise Au, Pd, Pt, Cu, Ni, Co, Fe, Mn, Mg, Ti, Zr, or alloys thereof. In a particular embodiment, dip soldering is used to coat metal foil 102 to form solder layers 103. In other embodiments, other coating techniques may be used to produce preform 101, such as plating, cladding, or sputtering.

Figure 2:
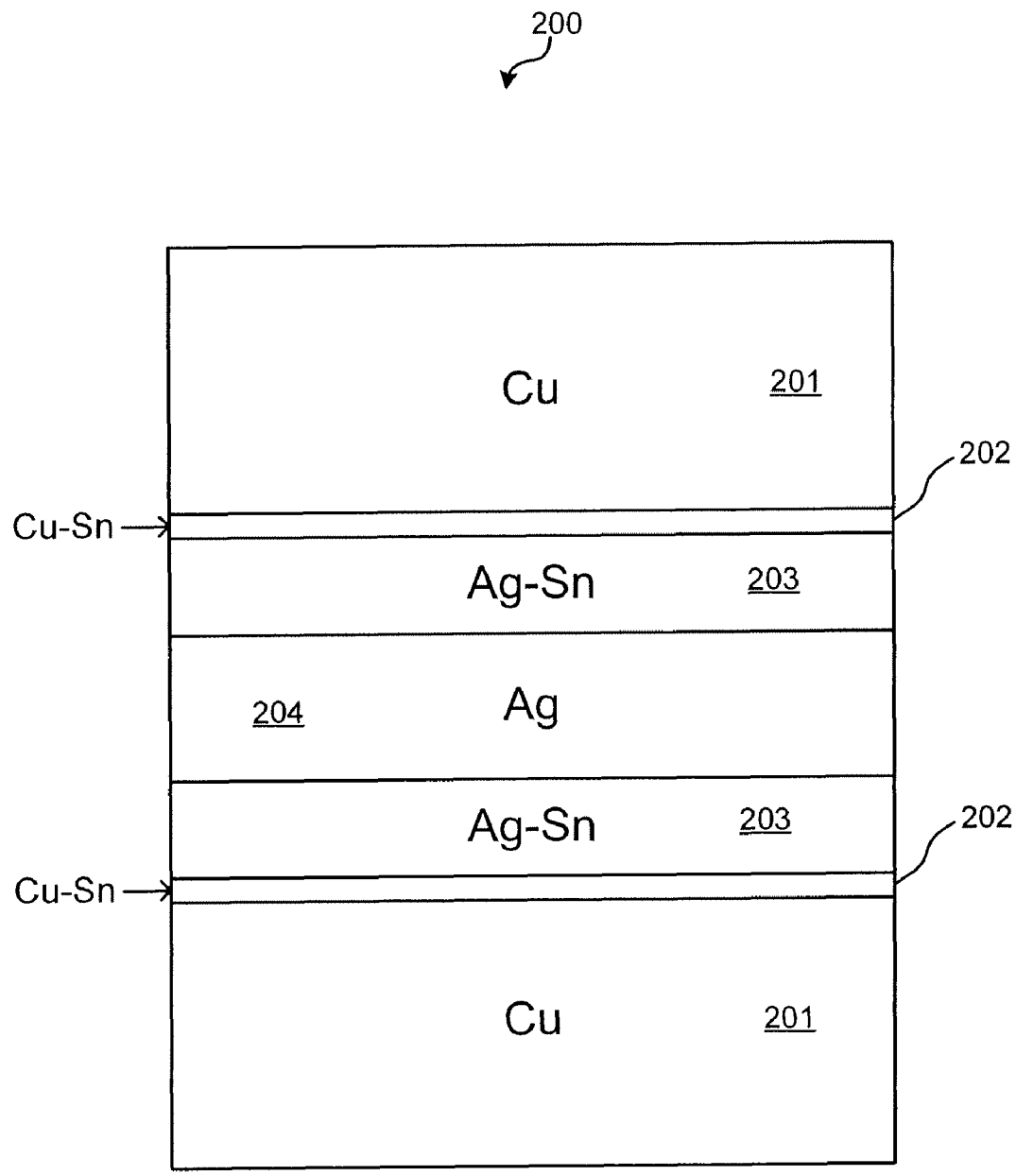
FIG. 2 is a diagram illustrating a solder joint resulting from use of a composite preform foil in reflow soldering according to an embodiment of the invention.

FIG. 2 is a diagram of a solder joint resulting from the use of a preform comprising a Ag core layer sandwiched with Sn—Ag solder alloy layers. This figure illustrates the IMC/metal/IMC laminate structure of a solder joint 200, as described above. In the illustrated embodiment, two Cu substrates 201 are bonded together using a solder preform comprising Ag 204 coated with a Sn—Ag based solder. After reflow, the joint 200 comprises Cu substrate layers 201 bonded with Cu—Sn IMC layers 202, which are bonded with Ag—Sn IMC layers 203, which sandwich Ag layer 204. In the illustration, the Cu—Sn IMC layers 202 are significantly thinner than the Ag—Sn layers 203. This is a result of the compositions of the components of the preform and the substrates employed. The relative thicknesses and presences of the IMC phases will typically vary depending on the substrates, thicknesses of the solder layers, the reflow processing conditions, and compositions of the metal layers and solder layers. For example, as larger thicknesses of solders are used, the IMC layers may comprise various heterogeneous phases. In these embodiments, Ag core layer thicknesses vary between about 40-60 μm. In other embodiments, core layers may vary between about 10-100 μm, or larger ranges. The solder layers may vary between about 5-30 μm for Sn—Ag solders. In further embodiments, these thicknesses may vary depending on applications, bonding characteristics, IMC formation, and other process variations. For example, in some embodiments solder layer thickness may vary between 5-50 μm.

Figure 3:
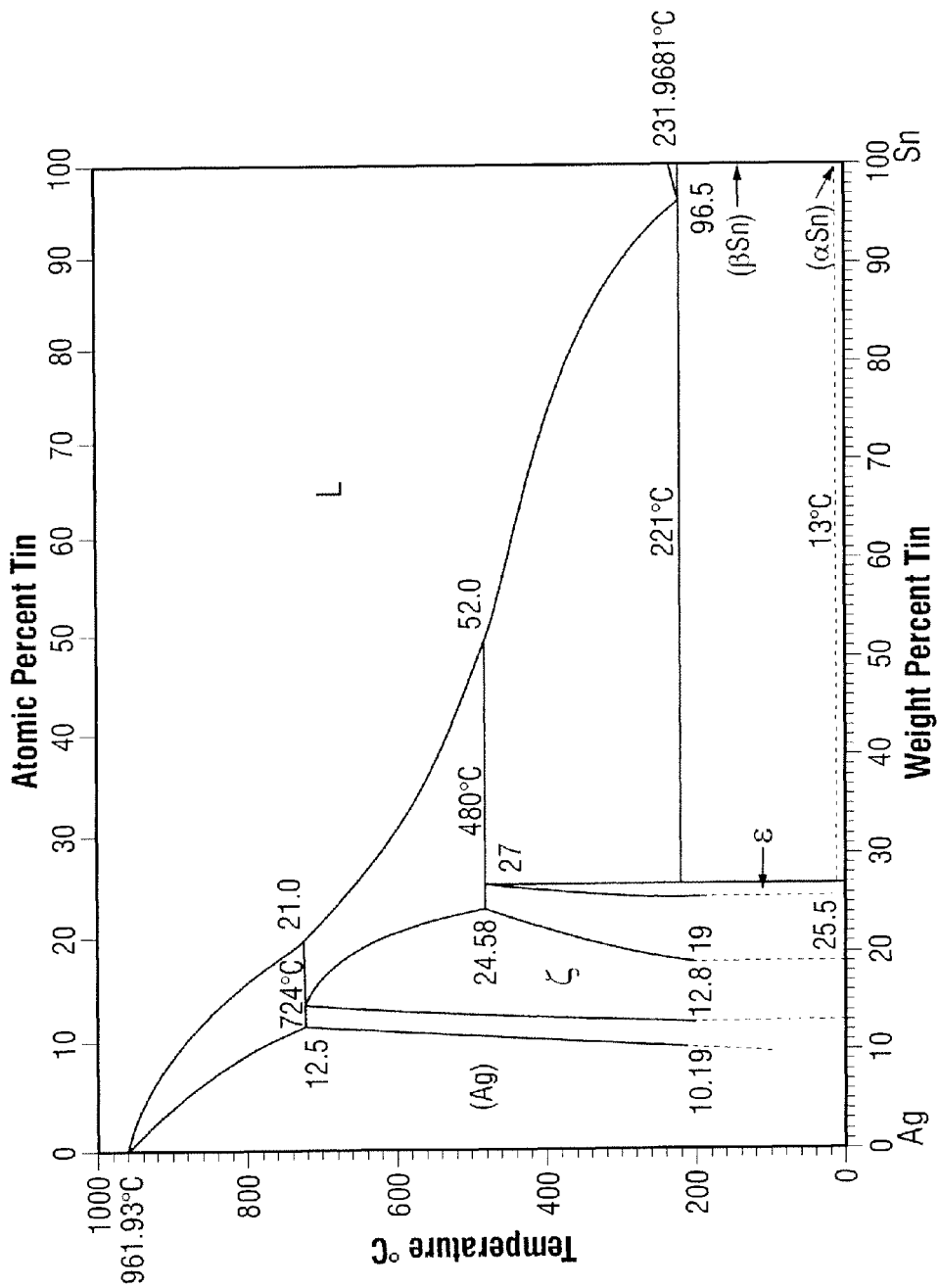
FIG. 3 is a binary phase diagram of the Sn—Ag system, presented for aid in reference.

FIG. 4-6 illustrate microstructures of solder joints resulting from the use of various embodiments of the invention. FIG. 3 is the binary phase diagram for the Ag—Sn system, presented for reference purposes. In these exemplary embodiments, An Ag ribbon of 25 to 80 μm in thickness was used as the core layer in a composite preform foil in this example. The ribbon was coated with a Sn3.5Ag eutectic solder layer at both sides by dip soldering. Various thicknesses of Sn—Ag solder layers ranging from 5 μm to about 30 μm were obtained by controlling the processing conditions of the coating process. Preforms were then made from the composite foil.

In embodiments used for the joints illustrated in FIGS. 4A-4D, commercial purity (CP) Cu coupons with dimensions of 15 mm (length) by 12 mm (width) by 0.6 mm (thickness) were used as substrates to be bonded. The Cu substrates were printed with flux of the preform size at the center of the surface to be bonded. A piece of composite preform foil was sandwiched between the two fluxed Cu substrates. The assembly was placed in an infrared (IR) reflow oven, and was heated to approximately 300-380° C. for about 5-8 minutes and then cooled. During soldering when the temperature is above 221° C. (the initial melting temperature of the Sn3.5Ag solder layer), the Sn in the molten liquid solder diffuses into the Ag core layer and the Cu substrates while Ag and Cu diffuse into the solder layer. This interaction process greatly reduces the Sn concentration in the melt layer, thus resulting in an isothermal solidification process and converting the low melting Sn—Ag solder into predominantly Ag—Sn IMCs ($Ag_3Sn$ plus ζ phase, see the Sn—Ag binary phase diagram shown in FIG. 3 for reference) in addition to a relatively thin Cu—Sn IMCs layer at the interface.

Figure 4A:
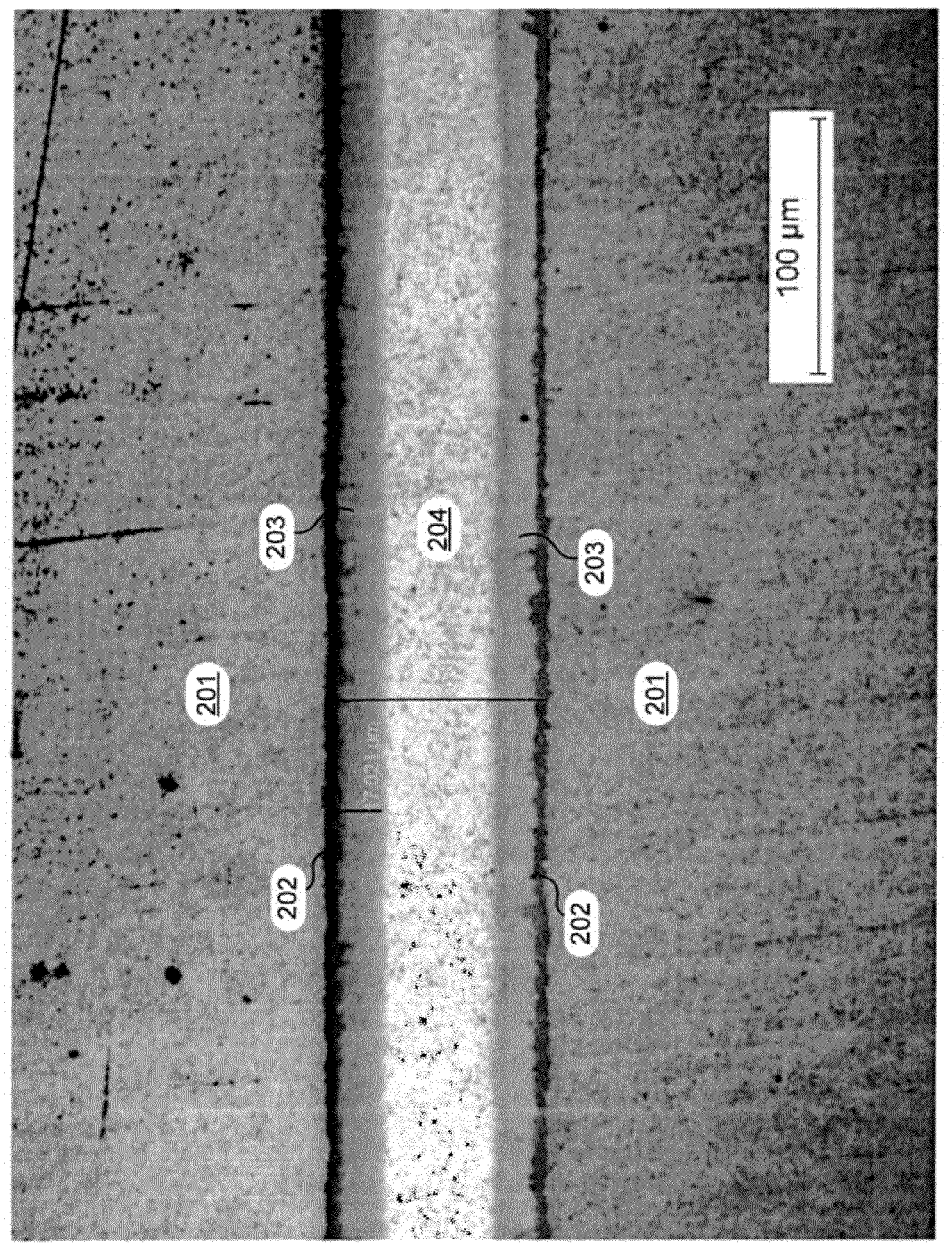
FIGS. 4A-4D are microstructures of solder joints resulting from the use of various embodiments of the invention to join Cu substrates.
Figure 4B:
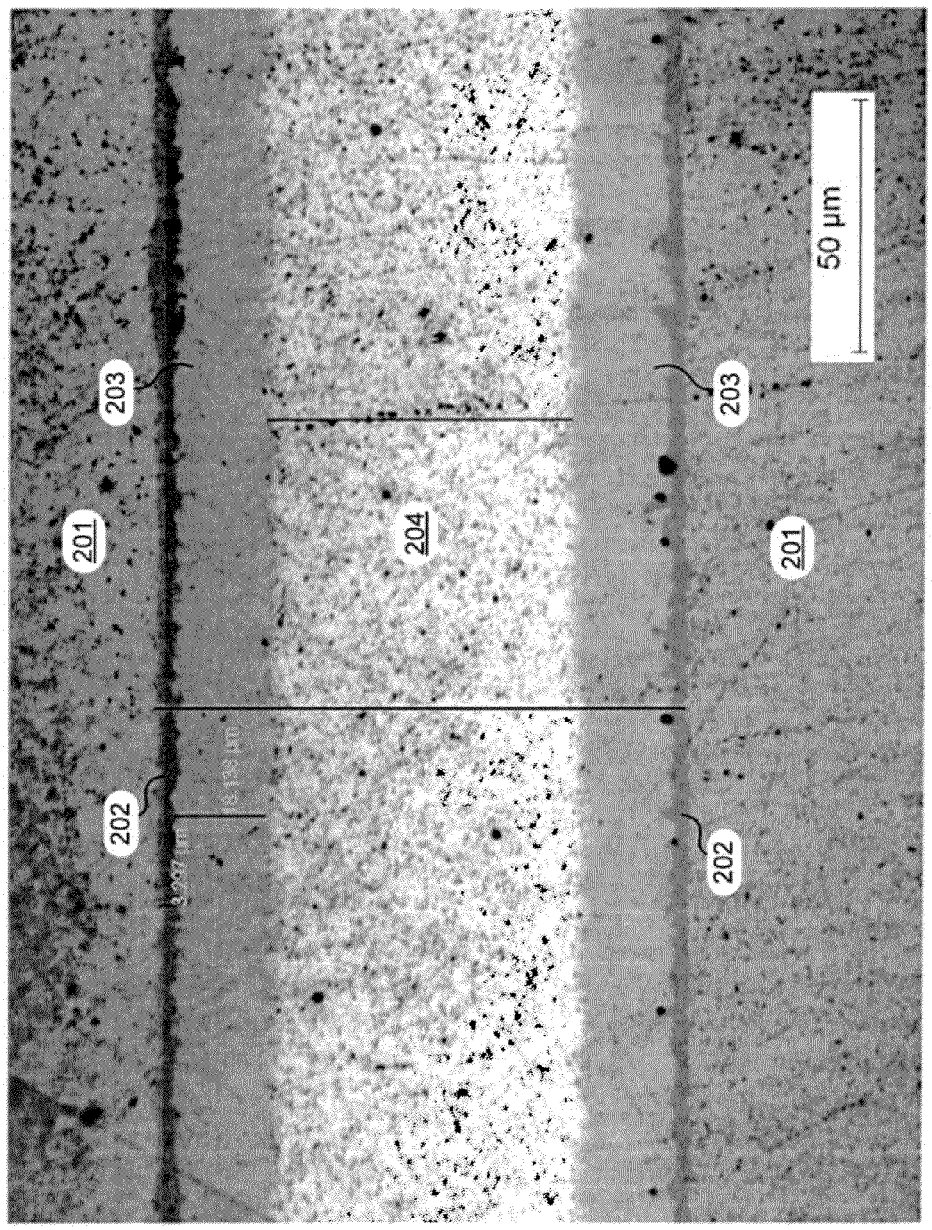

The microstructures in FIGS. 4A and 4B were accomplished with a similarly thin solder layer thickness and different Ag core layer thicknesses, respectively. FIG. 4E is a drawing illustrating the joint of FIG. 4A, while FIG. 4F is a drawing illustrating lower IMC layers of the joint in FIG. 4B. The joint of FIG. 4A had a resultant thickness of about 86 μm, with Ag—Sn IMC layers 203 of about 17 μm. The joint of FIG. 4B had a resultant thickness of about 105 μm, the Ag—Sn IMC layers 203 had thicknesses about 18 μm, the Cu—Sn IMC layers 202 had thicknesses about 3 μm, and the core metal layer 204 had a thickness of about 60 μm. As can be seen, fully isothermally-solidified joints with the microstructure features described in FIG. 2 were achieved.

Figure 4C:
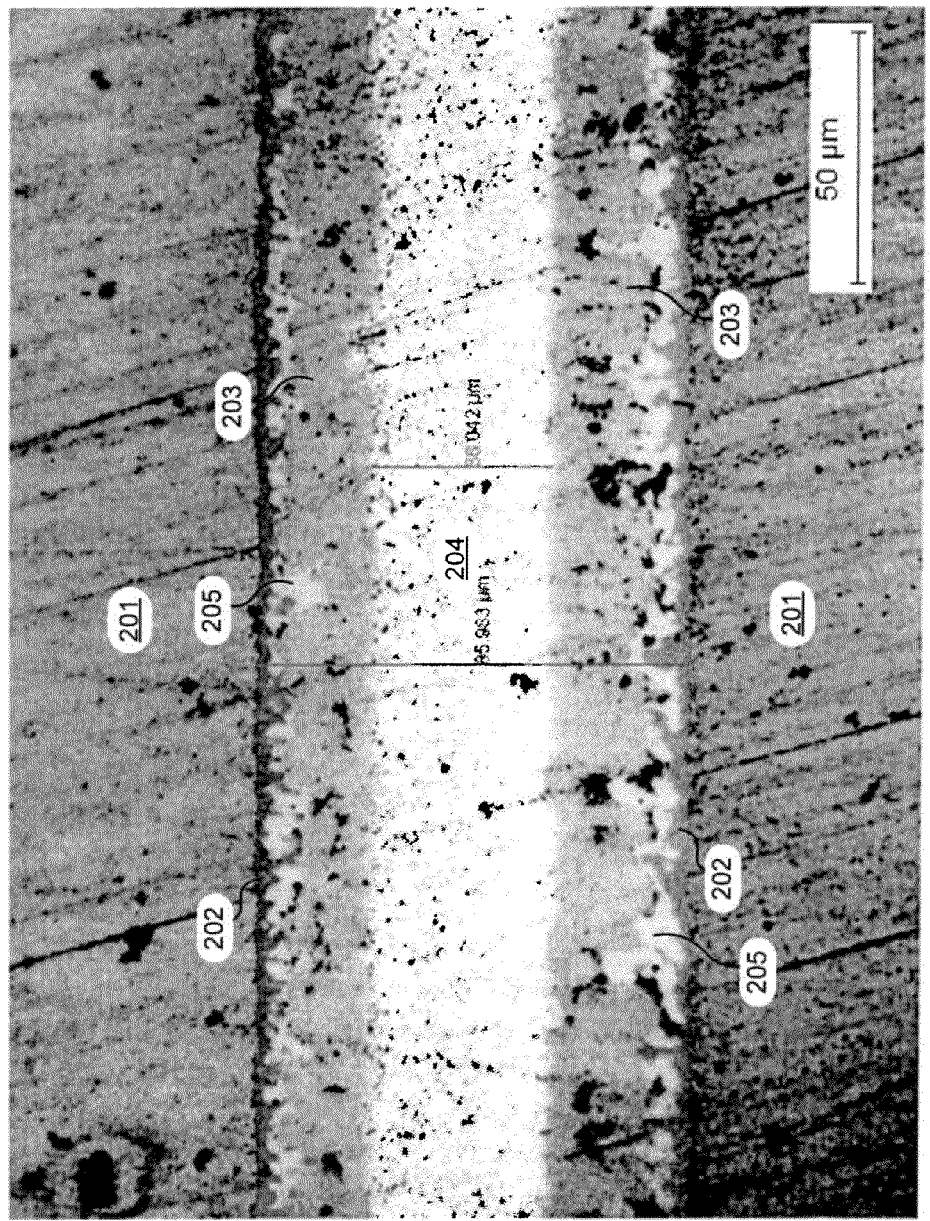

In the example illustrated by FIG. 4C, the preform had relatively thicker solder layers. This figure shows that as the solder layer thickness increases, heterogeneous intermetallic phases 205 exist in the solder joint. The resultant joint had a thickness of about 86 μm and a remaining core metal layer of about 36 μm. FIG. 4G is a drawing illustrating these phases in the upper portion of the joint of FIG. 4C.

Figure 4D:
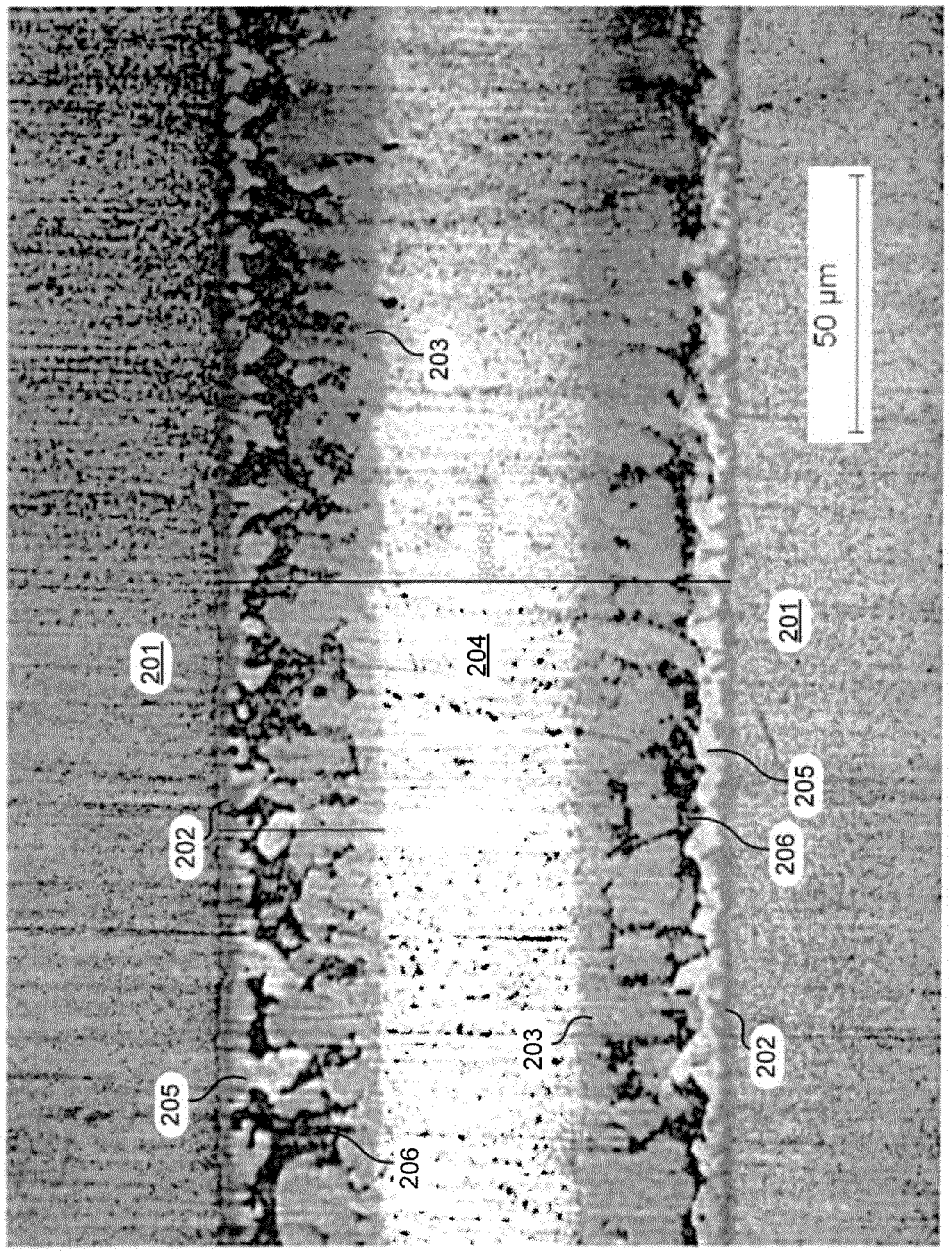
Figure 4E:
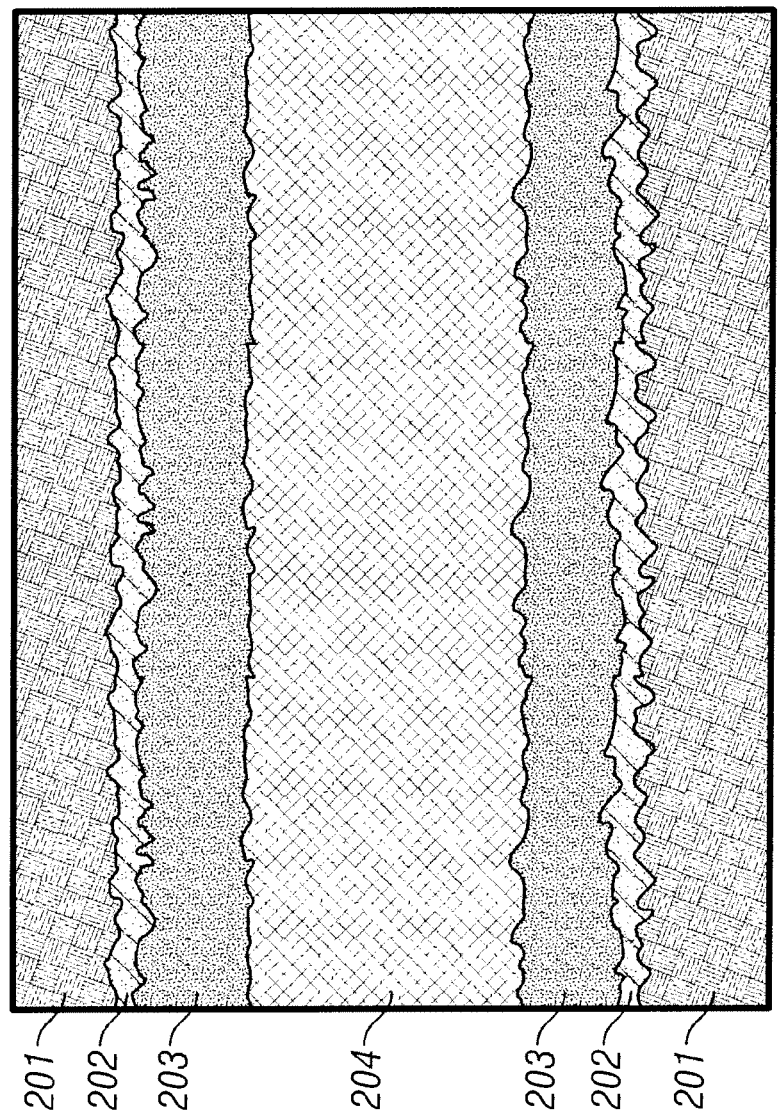
FIGS. 4E-4H are illustrations of the solder joints of FIGS. 4A-4D.
Figure 4F:
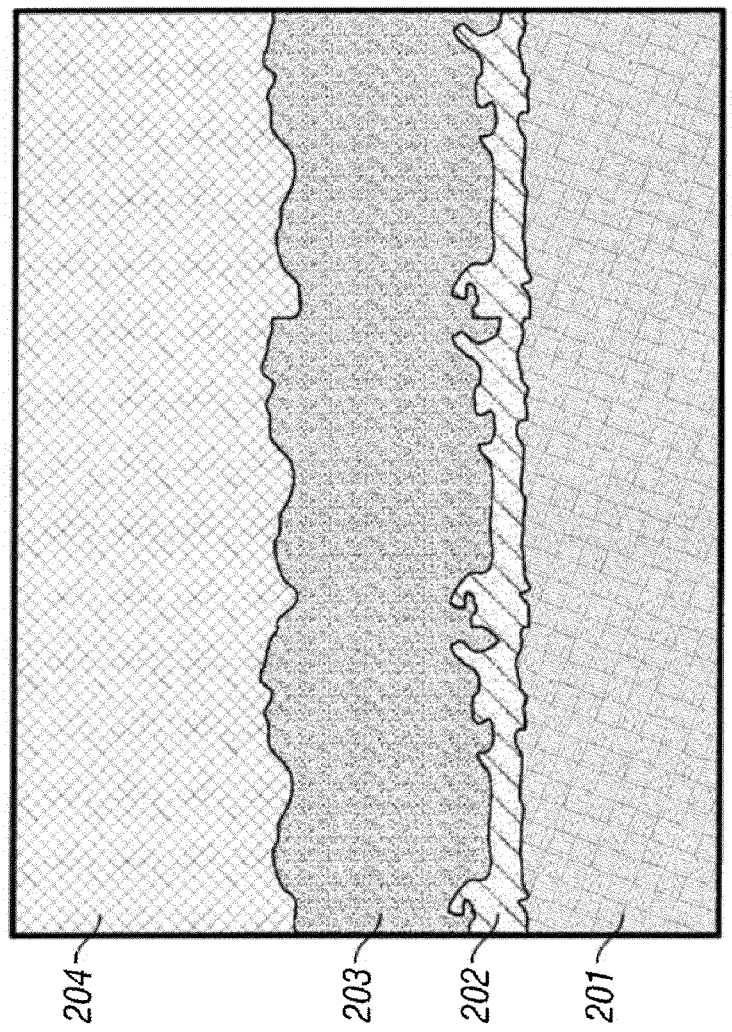
Figure 4G:
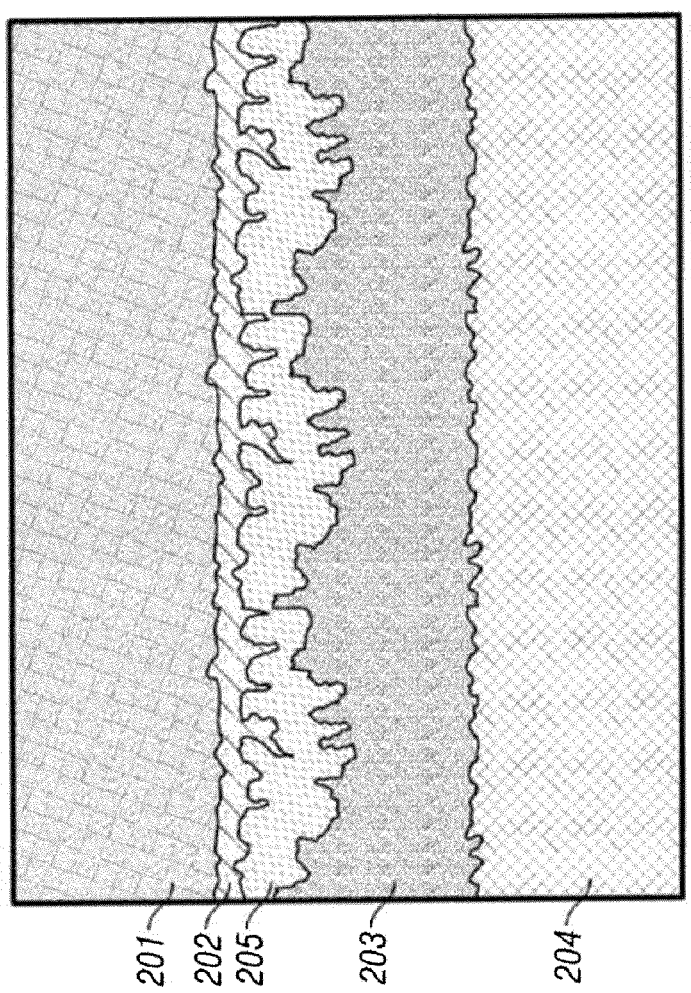
Figure 4H:
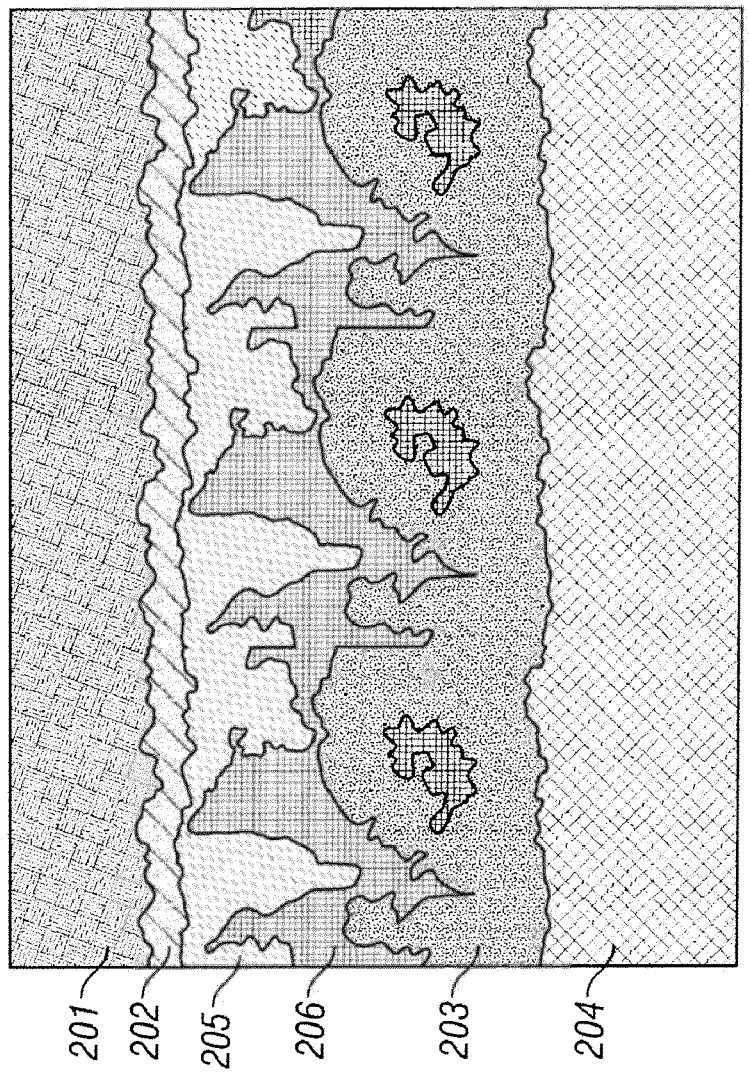

In the example illustrated by FIG. 4D, the preform had even thicker solder layers. This figure shows that as the solder layer thickness increases further, residual low-melting solder phases 206 remained in the solder joint under the reflow processing conditions used in this experiment. These low-melting phases can be converted into high-melting IMCs by using a higher reflow temperature or a longer TAL or a combination of both. Alternatively, the low-melting phases can be eliminated by a post-joining thermal treatment or allowed to remain in the joint. In particular, when the low-melting phases do not form a continuous region between the IMC layers and the substrate, the resultant joint may be satisfactory. FIG. 4H is a drawing illustrating these phases in the upper portion of the joint of FIG. 4D.

Figure 5A:
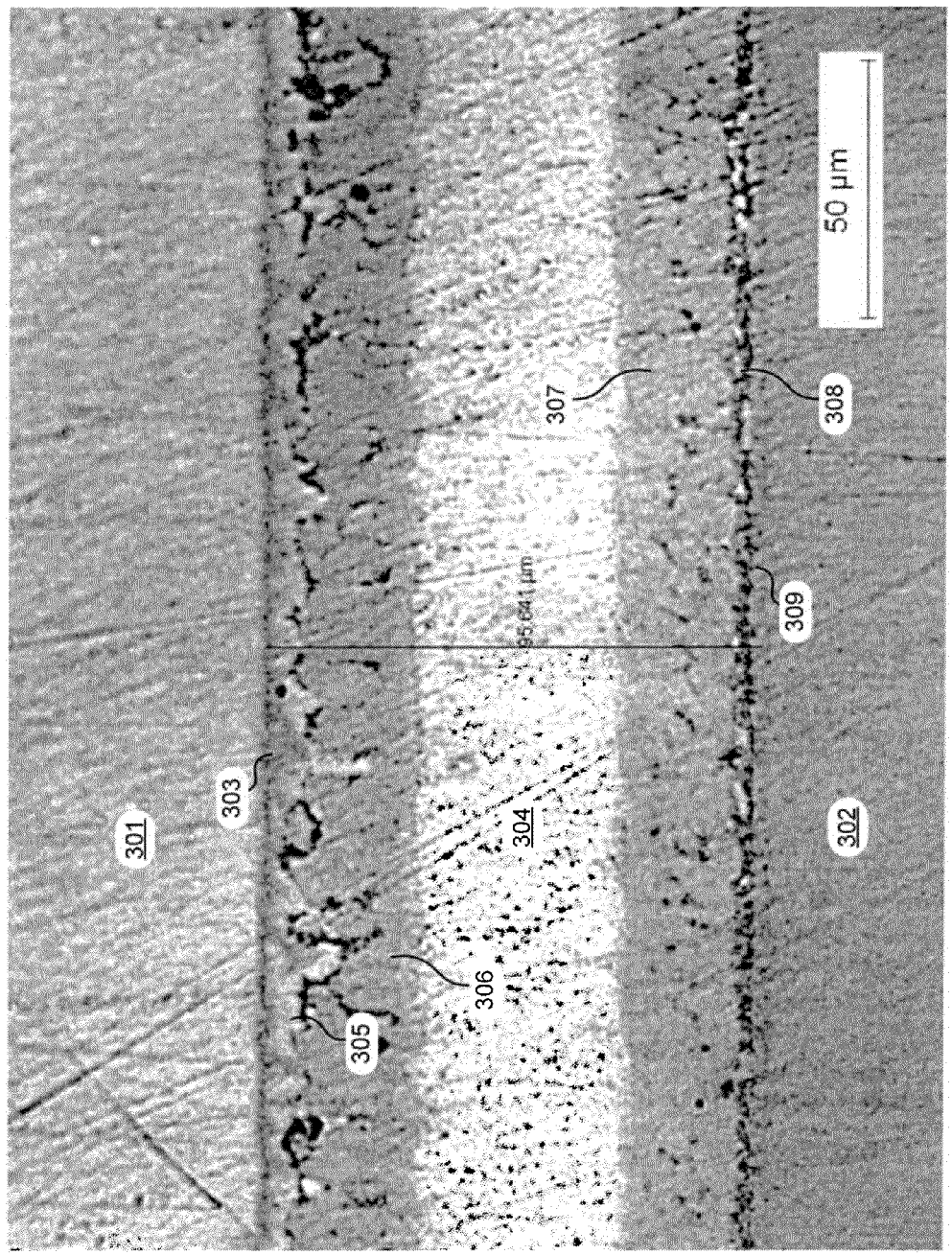
FIG. 5A is microstructure of a solder joint resulting from the use of various embodiments of the invention to join a Cu substrate to an Alloy 42 substrate.
Figure 5B:
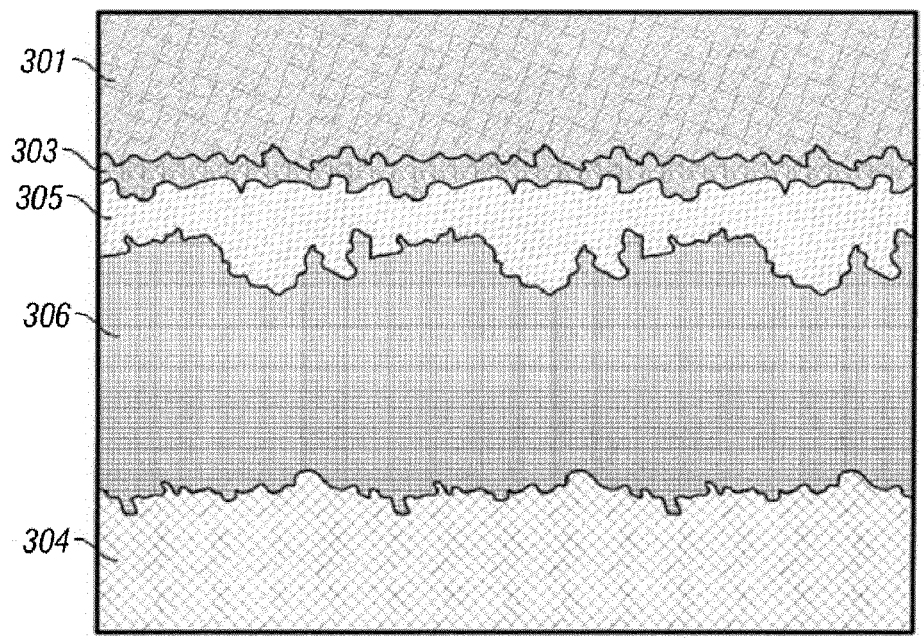
FIGS. 5B and 5C are illustrations of the solder joint of FIG. 5A.
Figure 5C:
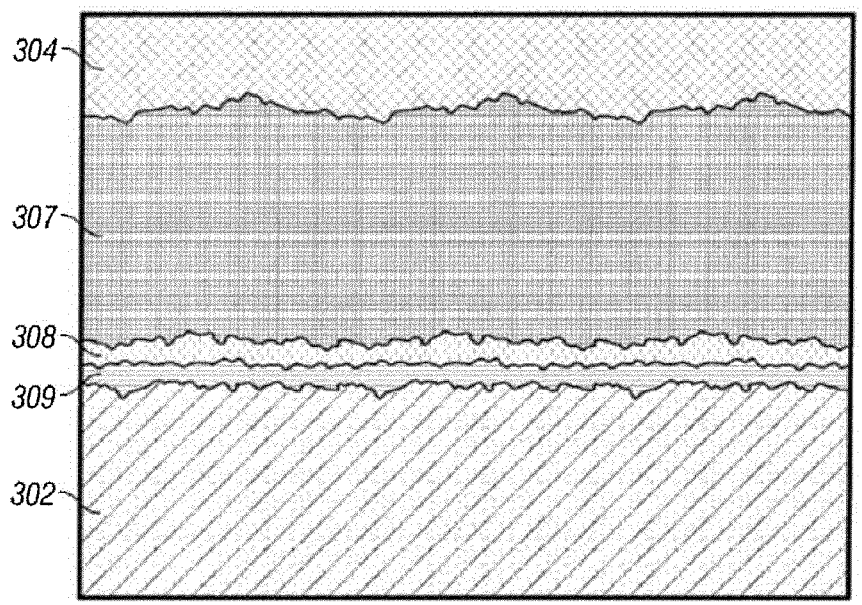

FIG. 5A shows a joint formed using a laminate preform having a first layer of Sn—Ag solder, a core Ag layer, and a second layer of Sn—Ag solder when dissimilar substrates were used. The solder preform was used to join a Cu substrate 301 coupon with dimensions of 15 mm (length) by 12 mm (width) by 0.6 mm (thickness) and a Alloy 42 substrate 302 (Fe42Ni) coupon with dimensions of 15 mm (length) by 12 mm (width) by 0.25 mm (thickness). The reflow processing conditions were similar to those used to produce the joints illustrated in FIGS. 4A-4D. In this embodiment, similarly to the Cu-to-Cu solder joints, the joint had a laminate composite form comprising a first layer of IMCs between Alloy 42 substrate 302 and metal layer 304 and a second layer of IMCs between Cu substrate 301 and metal layer 304. Here, three IMC phases, 309, 308, and 307 were formed between the Ag core 304 and the Alloy 42 substrate 302. Three IMC phases 303, 305, and 306 were formed between the Cu substrate 301 and the Ag core 304. FIGS. 5B and 5C illustrate upper and lower portions of the joint, respectively.

Figure 6A:
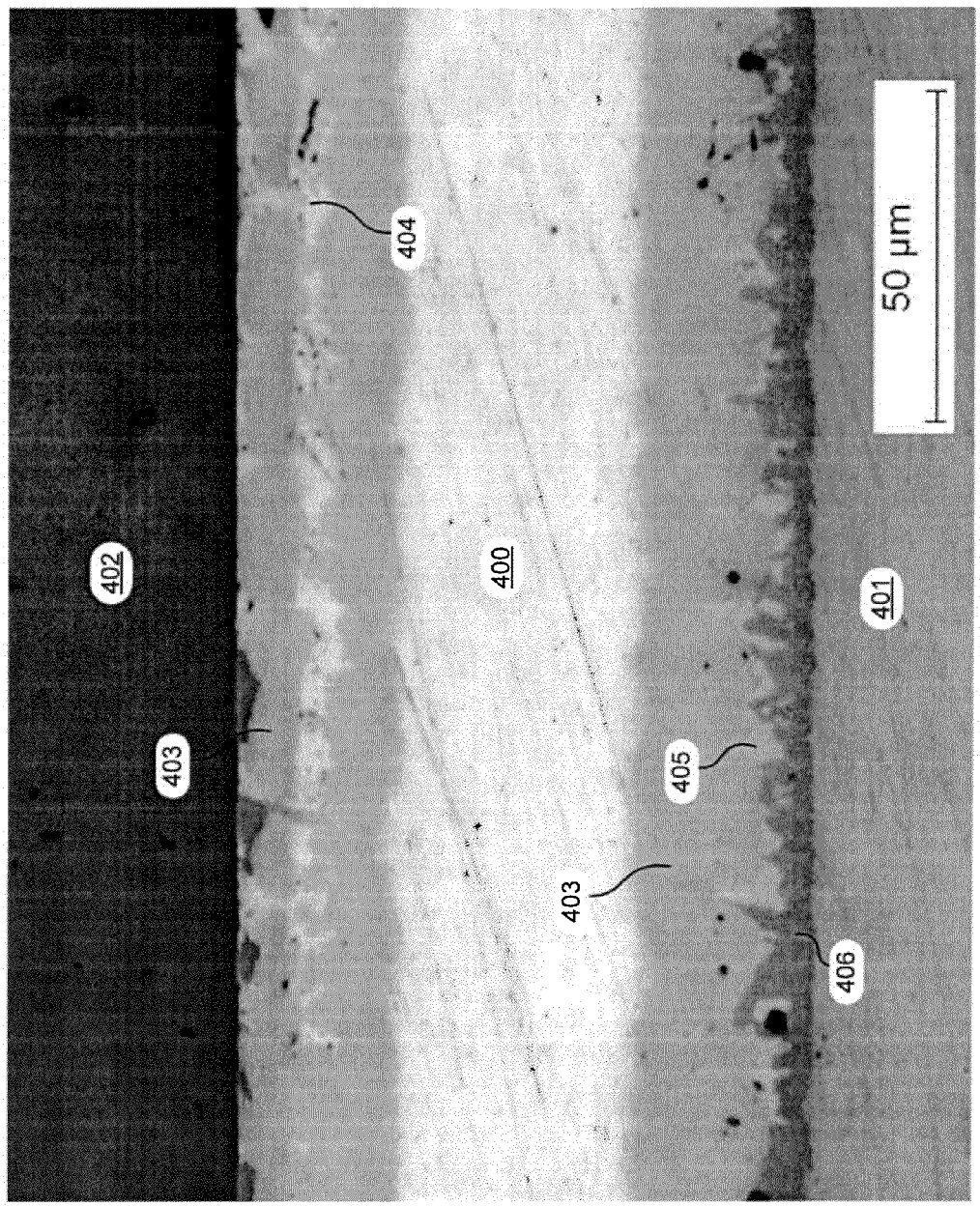
FIGS. 6A and 6D are microstructures of solder joints resulting from the use of various embodiments of the invention to join a Cu substrate to a metallized silicon die.
Figure 6B:
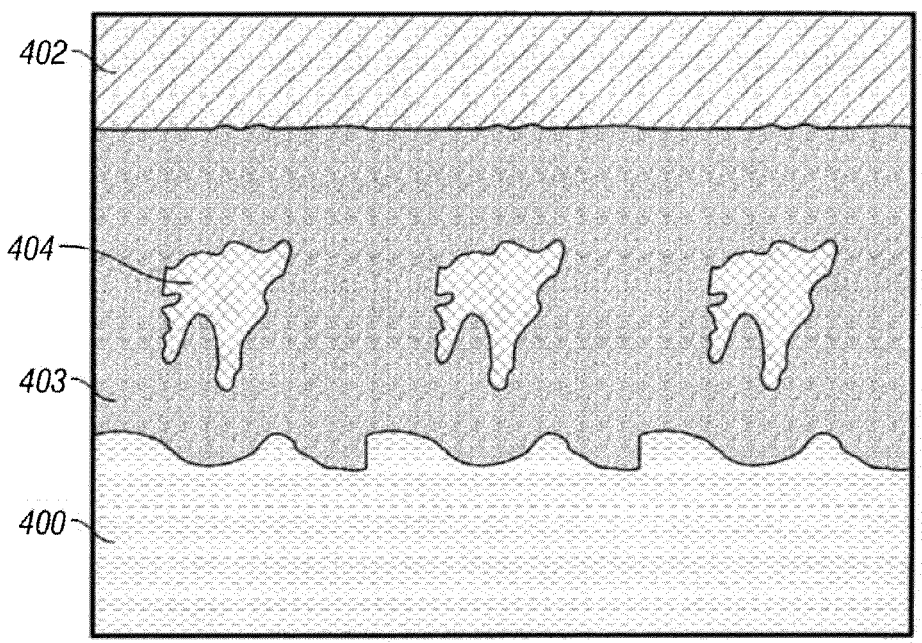
FIGS. 6B and 6C are illustrations of the solder joint of FIG. 6A.
Figure 6C:
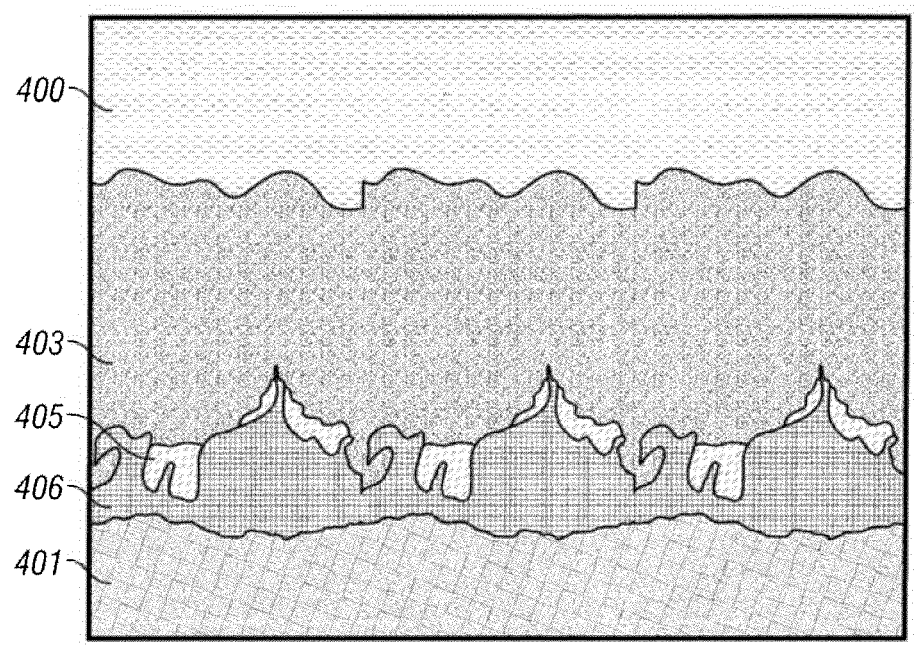
Figure 6D:
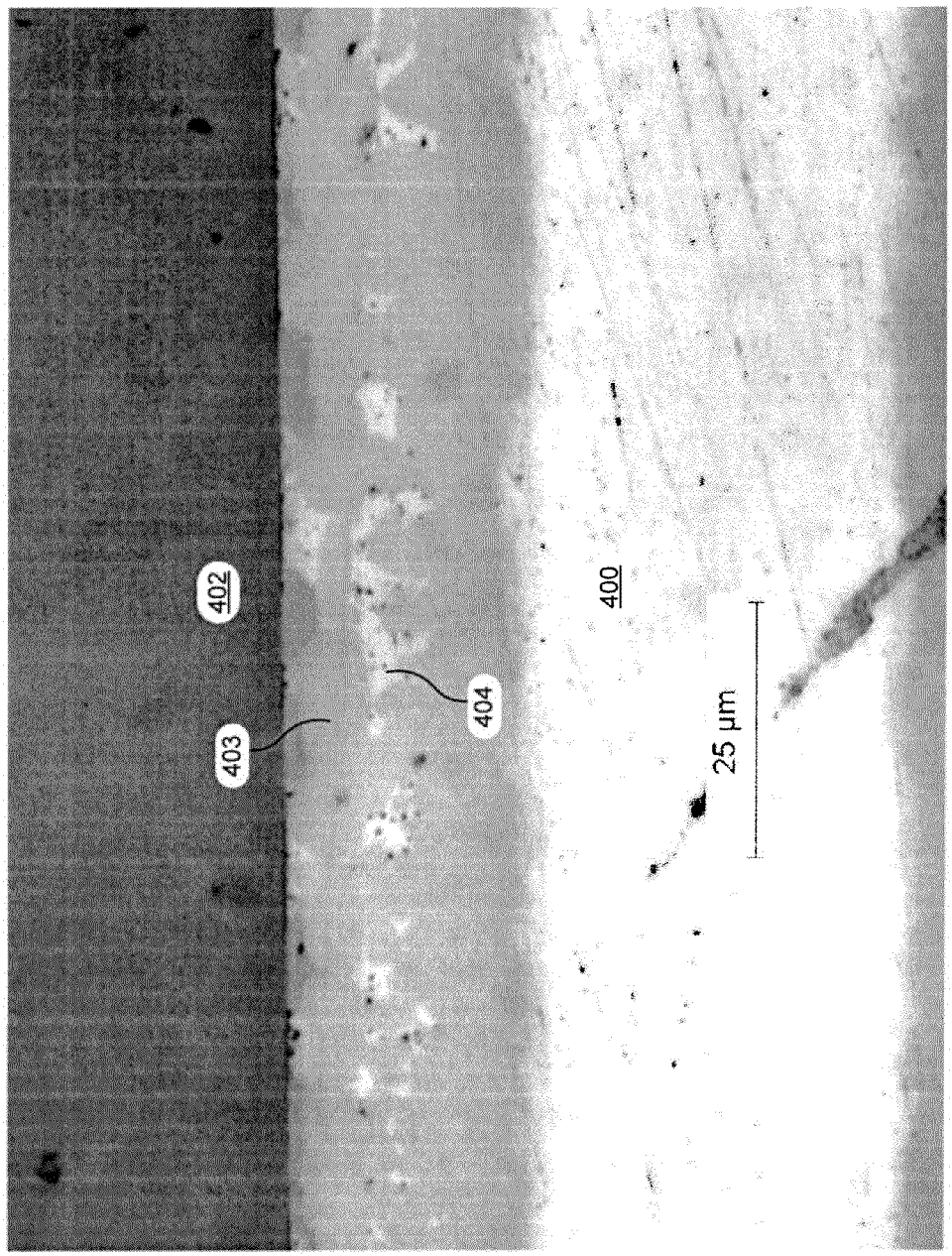
Figure 6E:
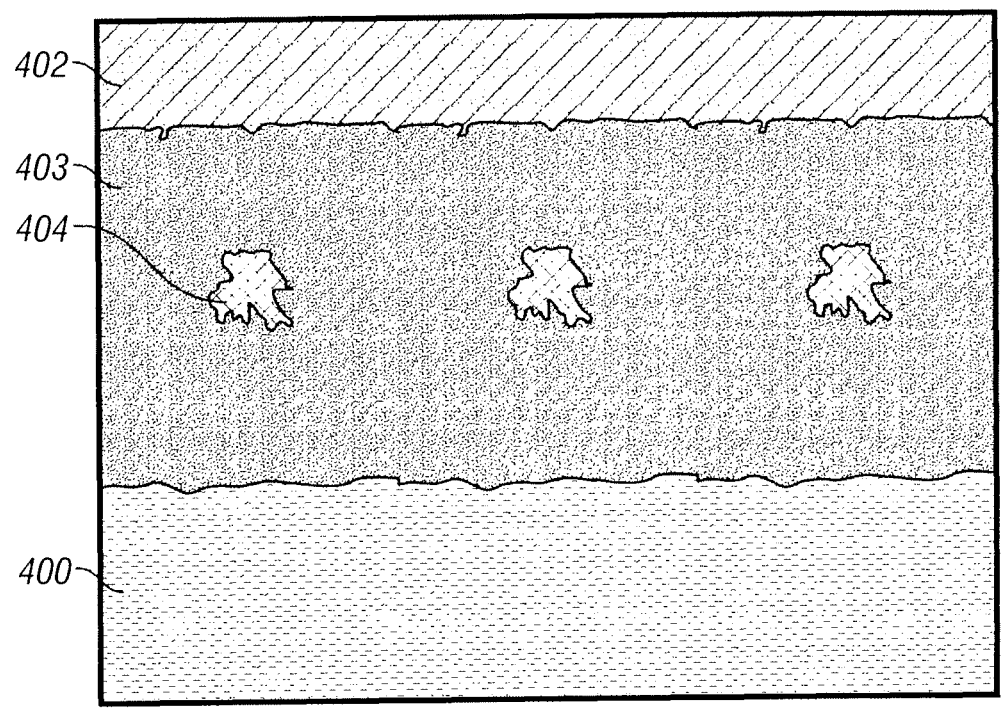

FIGS. 6A and 6D illustrate the joint resulting from using a composite preform to join a silicon die to a Cu substrate. FIGS. 6B and 6C illustrate upper and lower portions of the joint in FIG. 6A, respectively. FIG. 6E illustrates an upper portion of the joint in FIG. 6D. The silicon die 402, with a size of 0.92 mm (length) by 0.92 mm (width) by 0.21 mm (thickness), was prepared with a metallization layer structure of Ti/Ni/Ag. The metallization layers, with the thicknesses being Ti 0.1 µm, Ni 0.2 µm, and Ag 0.8 µm, were deposited by a sputtering process. The reflowing processing conditions used were similar to those used in FIGS. 4A-4D. The composite preform had a Ag core layer and SnAg solder layers. Good bonding was achieved between the silicon die 402 and the composite preform as well as between the Cu substrate 401 and the composite preform. Although a very small amount of residual low-melting phases 404 can be observed within the Ag—Sn IMC layer 403 at the silicon side, this could be removed with increased temperature or TAL, or may be ignored because it does not sufficiently impair the bond or reduce ability for further low temperature soldering.

Figure 7A:
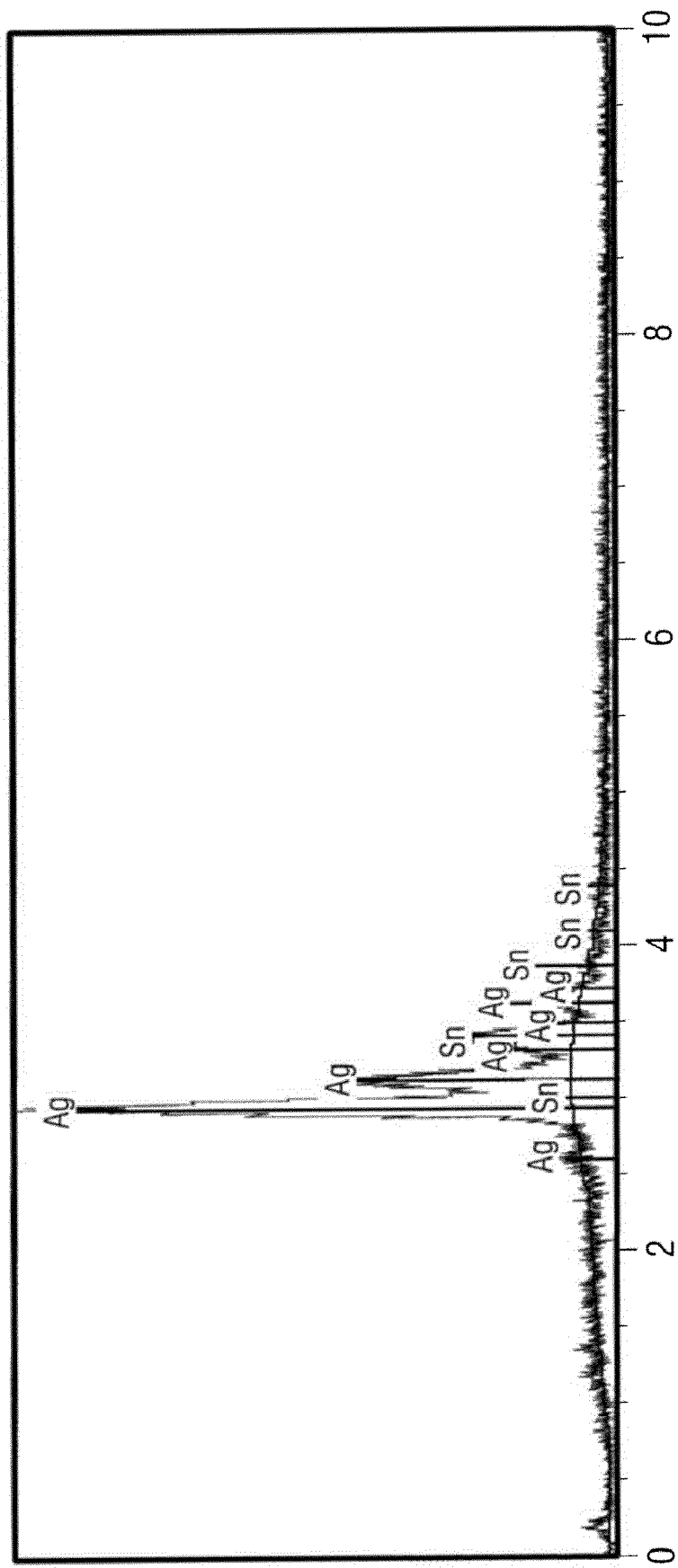
FIGS. 7A and 7B are results of energy dispersive X-ray spectroscopy analyses performed on the intermetallic layers present in the solder joints of FIGS. 6A and 6D.
Figure 7B:
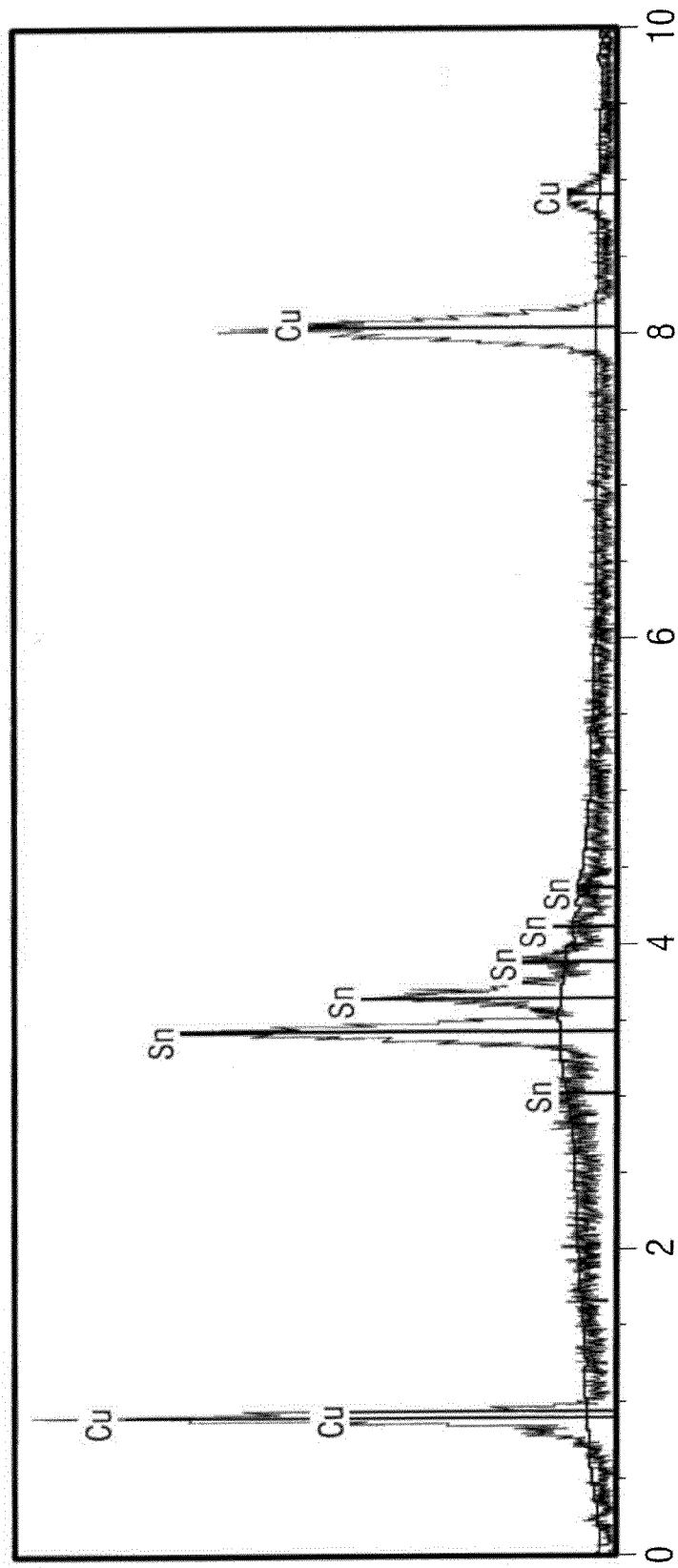

FIGS. 7A and 7B illustrate the results of quantitative energy dispersive X-ray spectroscopy (EDS) analyses performed on the Ag—Sn IMC phase 403 and the Cu—Sn IMC phase 406, respectively. FIG. 7A indicates that the predominant Ag—Sn IMC phase formed has a composition of 81.5Ag18.5Sn (wt %), which corresponds to the $\zeta$ phase in the binary Ag—Sn phase diagram (FIG. 3). FIG. 7B indicates that the Cu—Sn IMC phase formed between the composite preform and the Cu substrate was $Cu_3Sn$. It is to be noted that the remelt temperature of the phase is between 480° C. and 724° C., as can be seen from Ag—Sn phase diagram (FIG. 3), depending on the composition of the phase, enabling further low temperature soldering to be performed after die attachment.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

The invention claimed is:

1. A method of bonding, comprising:
   placing a composite preform foil between two pieces to be bonded to create an assembly; and
   reflow soldering the assembly with an appropriate reflow profile sufficient to cause the composite preform foil to undergo isothermal solidification to form a solder joint having a composite structure comprising a top intermetallic layer, a bottom intermetallic layer, and a center ductile metal or metal alloy layer between the top and bottom intermetallic layers;
   wherein the composite preform foil comprises a core metal layer comprising a metal selected from the group consisting of Ag, Au, Pd, Pt, Cu, Ni, Co, Fe, Mn Mg, Ti, Zr, or alloys thereof, the core metal layer having a solidus temperature greater than 280° C.;
   a first solder layer joined to the core metal layer, the first solder layer comprising a Sn-based solder or an In-based solder, and the first solder layer having a thickness equal to or greater than 5 µm; and
   a second solder layer joined to the core metal layer, the second solder layer comprising a Sn-based solder or an In-based solder, and the second solder layer having a thickness equal to or greater than 5 μm;

wherein the core metal layer has a sufficient thickness such that a layer of the metal remains after isothermal solidification in reflow soldering.

2. The method of claim 1, wherein the first solder layer and the second solder layer comprise a Sn-based solder alloy selected from the group of solder systems comprising SnAg, SnCu, SnBi, SnSb, SnZn, SnAu, SnAgCu, SnAgBi, SnAgIn, SnAgSb, SnAgCuBi, SnAgCuIn, SnAgCuSb, or combinations thereof.

3. The method of claim 1, wherein the core metal layer comprises Ag, Au, Pd, Pt, Cu, Ni, Mn, Mg, Ti, or alloys thereof, and wherein the first solder layer and the second solder layer comprise In or an In-based alloy selected from the group of alloy systems comprising InAg, InCu, InBi, InSb, InAgCu, InAgBi, InAgSn, InAgSb, InAgCuBi, InAgCuIn, InAgCuSb, or combinations thereof.

4. The method of claim 1, wherein the core metal layer comprises a pure Ag metal or Ag-based alloy having a solidus temperature above 400° C., and wherein the first solder layer and the second solder layer comprise a Sn—Ag or Sn—Ag based alloy having a Ag content from 0 to 73 wt %.

5. The method of claim 1, further comprising applying heat treatment processing to the assembly after the step of reflow soldering such that the first solder layer and the second solder layer are completely converted into intermetallic layers.

6. The method of claim 1, wherein the thickness of the first solder layer is different than the thickness of the second solder layer.

7. The method of claim 1, wherein the first solder layer is composed of a different material than the second solder layer.

8. The method of claim 1, wherein the composite structure further comprises a second top intermetallic layer adjacent to the first top intermetallic layer.

9. The method of claim 1, wherein the composite structure further comprises a second bottom intermetallic layer adjacent to the first bottom intermetallic layer.

10. The method of claim 1, wherein the composite structure further comprises a second top intermetallic layer adjacent to the first top intermetallic layer and a second bottom intermetallic layer adjacent to the first bottom intermetallic layer.

11. The method of claim 1, wherein the reflow profile includes heating the assembly to a peak temperature of at least 300° C.

12. The method of claim 1, wherein the reflow profile includes heating the assembly to a peak temperature of at least 280° C.

13. The method of claim 1, wherein after reflow soldering the assembly, the top and bottom intermetallic layers have melting temperatures greater than 280° C.

* * * * *